United States Patent [19]

Huang et al.

[11] Patent Number: 5,459,095
[45] Date of Patent: Oct. 17, 1995

[54] METHOD FOR MAKING CAPACITOR FOR USE IN DRAM CELL USING TRIPLE LAYERS OF PHOTORESIST

[75] Inventors: Cheng-Han Huang, Hsin-Chu; Water Lur, Taipei, both of Taiwan

[73] Assignee: United Microelectronics Corporation, Hsin-Chu, Taiwan

[21] Appl. No.: 233,646

[22] Filed: Apr. 26, 1994

[51] Int. Cl.⁶ ............................................. H01L 21/8242
[52] U.S. Cl. ..................... 437/52; 437/47; 437/60; 437/228; 437/229; 437/919
[58] Field of Search ................... 437/47, 48, 52, 437/60, 228, 229, 919; 257/306, 309

[56] References Cited

U.S. PATENT DOCUMENTS

| 5,134,086 | 7/1992 | Ahm ........................................ 437/977 |
| 5,227,322 | 7/1993 | Ko et al. ................................... 437/60 |

*Primary Examiner*—Tom Thomas
*Attorney, Agent, or Firm*—Meltzer, Lippe, Goldstein et al.

[57] ABSTRACT

A MOS capacitor structure in accordance with the invention is formed by depositing a polysilicon electrode layer on the substrate. Oxide regions are then formed on the polysilicon layer. Using the oxide regions as a mask, pillars are etched in the polysilicon electrode layer.

6 Claims, 3 Drawing Sheets

METHOD FOR MAKING CAPACITOR FOR USE IN DRAM CELL USING TRIPLE LAYERS OF PHOTORESIST

FIELD OF THE INVENTION

The present invention relates to a technique for forming a modulated stacked capacitor for use in a Dynamic Random Access Memory (DRAM) cell.

BACKGROUND OF THE INVENTION

A DRAM cell typically comprises a MOS transistor and a capacitor. An example of such a DRAM cell is shown in FIG. 1. The DRAM cell 10 of FIG. 1 comprises the MOSFET 12 and the capacitor 14. A word line is connected to the gate of the MOSFET 12. A bit line is connected to the source of the MOSFET 12. The capacitor 14 is connected to the drain of the MOSFET 12. The state of the DRAM cell 10 is determined by whether or not the capacitor 14 is holding a charge.

The DRAM cell is read by using the bit line to determine whether or not a charge is stored in the capacitor. The DRAM cell is written by using the bit line to add or remove charge from the capacitor. However, the cell can only be read or written when the cell is addressed (i.e. activated) by the word line.

With the continuous advancement of DRAM technology, the chip area used for one DRAM cell is getting smaller. There are two methods used to increase the capacitance of the capacitor in the DRAM cell. One method is to decrease the effective dielectric thickness and the other method is to increase the effective capacitor surface area.

It is expected that future scaled DRAM cells will rely heavily on the quality and storage capacity of ultra thin dielectric materials that are sandwiched between two heavily doped polysilicon and/or silicon electrodes. However, higher capacitance values cannot be obtained without seriously degrading the device retention time. Specifically, films thinner than 50 Angstroms present excessive leakage current due to direct carrier tunneling. For a given capacitor dielectric film, the larger the surface area, the larger the capacitance.

FIGS. 2,3,4,5 and 6 illustrate prior art DRAM cells. The DRAM cell 20 of FIG. 2 comprises a MOSFET 22 and a capacitor 24 which are both formed on a silicon substrate 25. The MOSFET 22 comprises the source and drain regions 26 and 28, which regions are separated by the channel 29. It should be noted that the source and drain regions 26, 28 have a conductivity type opposite to that of the substrate. A metal contact 27 directly contacts the source region 26. A gate 30 is formed from polysilicon material (Poly-1) and is separated from the surface of the substrate by an oxide layer 31. An additional oxide region 32 is on top of the gate 30.

The capacitor 24 sits on top of the drain region 28. The capacitor 24 has a first electrode 40 formed by a conducting polysilicon material (poly-2), a thin dielectric layer 42 which may be NO or ONO, and a second electrode 44 which is formed from a conducting polysilicon material (poly-3). The capacitor contacts the drain region 28 in a space between the oxide region 32 and the oxide region 52.

FIG. 3 shows a DRAM cell 20' which is similar to the DRAM cell 20 of FIG. 2. The main difference is that the shape of the poly-2 electrode layer 40, dielectric layer 42 and poly-3 electrode layer 44 have been altered to increase the surface area of the capacitor 24.

FIG. 4 shows a DRAM cell 20" in which the poly-2 electrode 40 has been made rugged to increase the surface area of the capacitor.

FIG. 5 shows a DRAM cell 20''' in which the polysilicon electrode 40 is formed from a plurality of horizontal layers 41 to increase the surface area of the capacitor.

Another capacitor structure which can be used to increase the capacitance of a DRAM cell is known as MOST (modulated stacked) capacitor. (See e.g. Y. K. Jun et al, "The Fabrication and Electrical Properties of Modulated Stacked Capacitor for Advance DRAM Applications" IEEE Electron Device Letters, Vol. 13, No. 8, August 1992, the contexts of which are incorporated herein by reference).

A DRAM cell 20'''' having a MOST capacitor structure is illustrated in FIG. 6. In the capacitor 24 of FIG. 6, the poly-2 electrode 40 comprises a plurality of spaced apart vertical pillars 43. The capacitor dielectric 42 and poly-3 electrode 44 are then deposited over the spaced apart vertical pillars 43. In this manner a capacitor with a large effective surface area is formed in a DRAM cell.

It is an object of the present invention to provide a technique for manufacture of a MOST capacitor for use in a DRAM cell.

SUMMARY OF THE INVENTION

According to one embodiment, a MOST capacitor for use in a DRAM cell is formed by depositing a conductive polysilicon electrode layer on the substrate. On the polysilicon layer, an oxide layer is then formed. A plurality of spaced apart oxide regions is formed from the oxide layer by repeating the following two steps. First a photoresist layer is formed on the oxide layer and patterned (e.g. using photolithography) to form spaced apart photoresist regions. Second, the oxide layer is etched through the patterned photoresist layer and the photoresist regions are removed. By repeating the above two steps, a plurality of spaced apart oxide regions is formed, such that the width of each oxide region is significantly smaller than the width of each of the photoresist regions. Using the oxide regions thus formed as a mask, the polysilicon layer is etched to form pillars therein. This permits the formation of pillars with smaller dimensions than the smallest dimension that can be formed using photolithography.

DETAILED DESCRIPTION OF THE INVENTION

Figure 1:
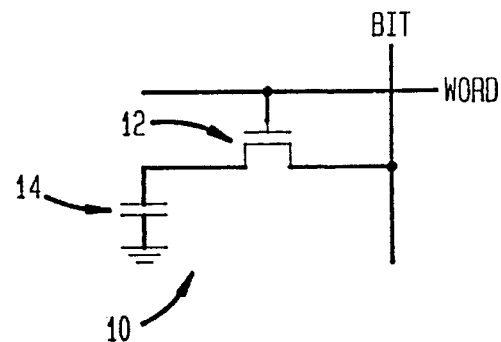
FIG. 1 schematically illustrates DRAM cell.
Figure 2:
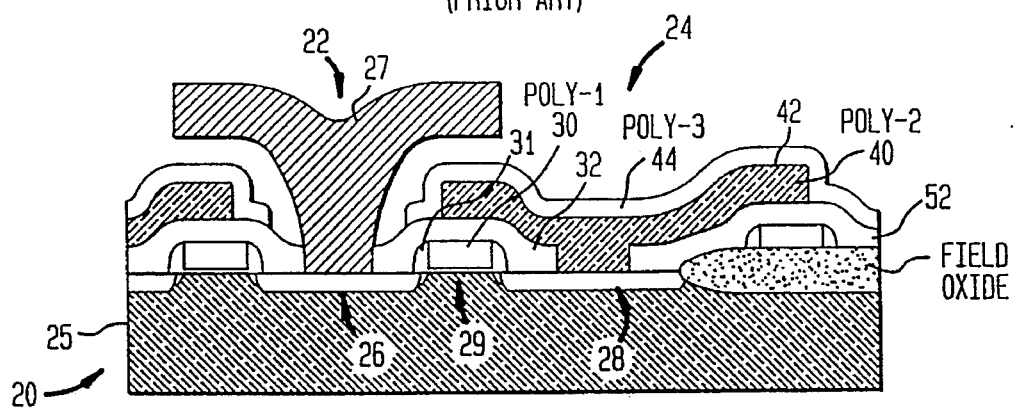
FIGS. 2–6 illustrate various prior art capacitors utilized in DRAM cells.
Figure 3:
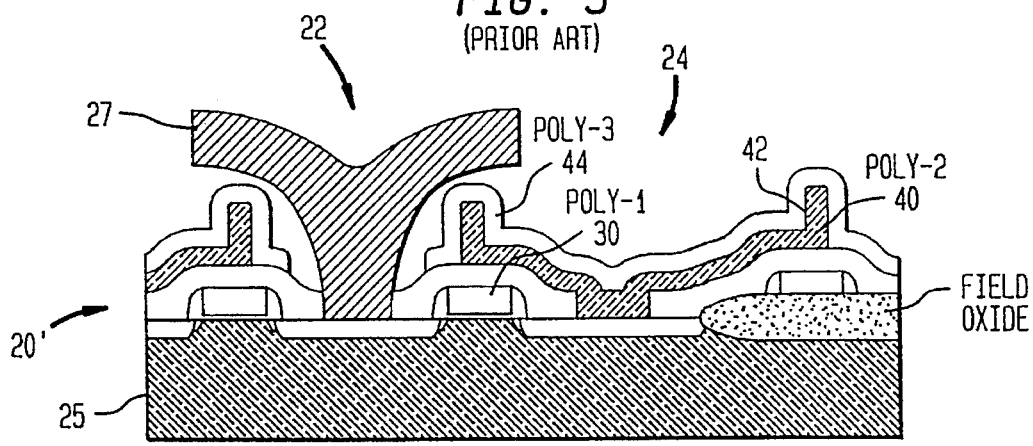
Figure 4:
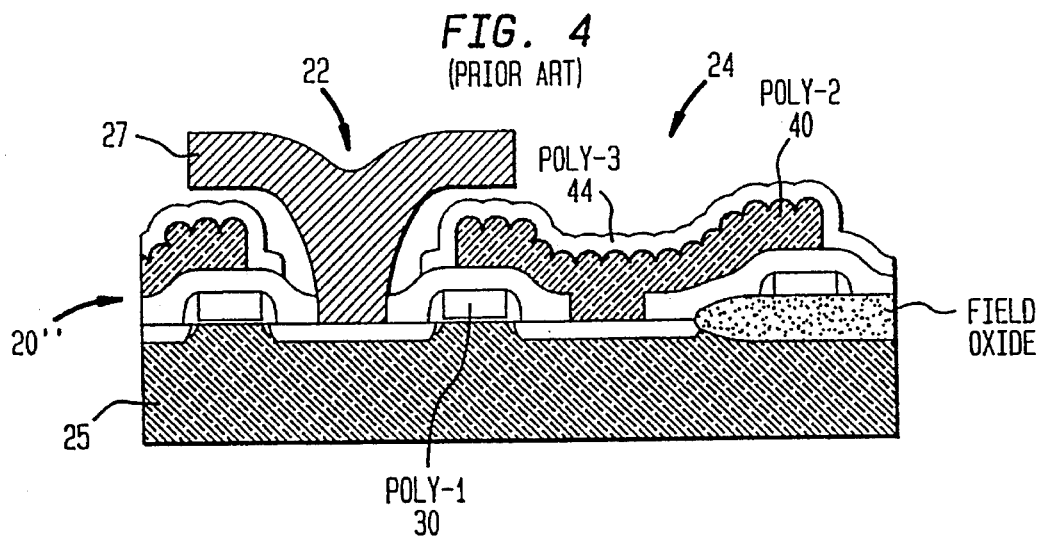
Figure 5:
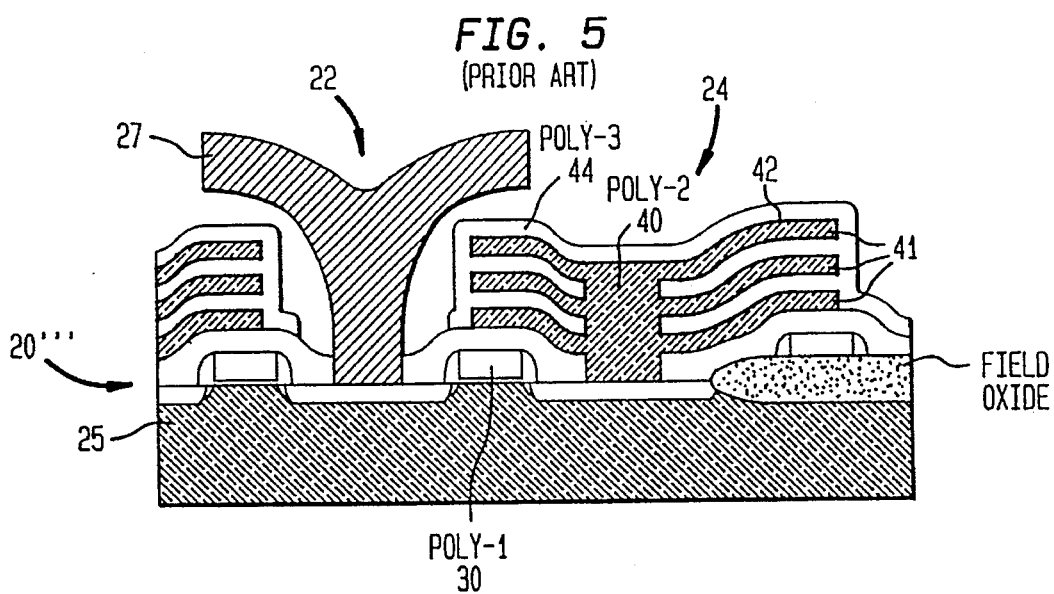
Figure 6:
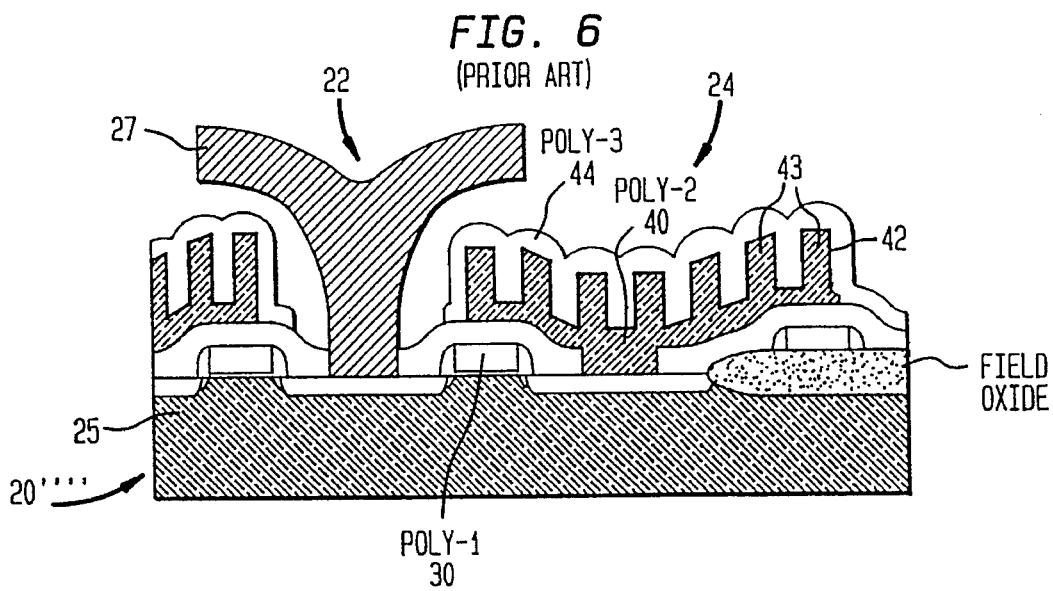
Figure 7A:
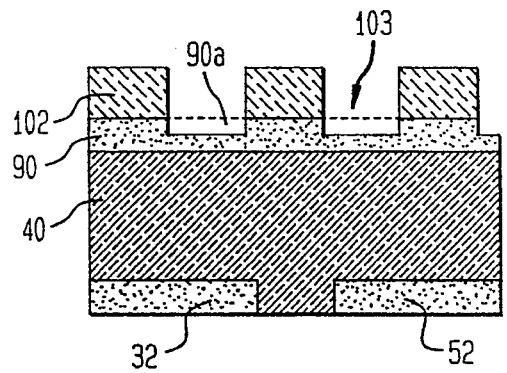
FIGS. 7(a), 7(b), 7(c), 7(d), 7(e) and 7(f) illustrate a technique for forming a MOST capacitor for use in a DRAM cell in accordance with the present invention.
Figure 7B:
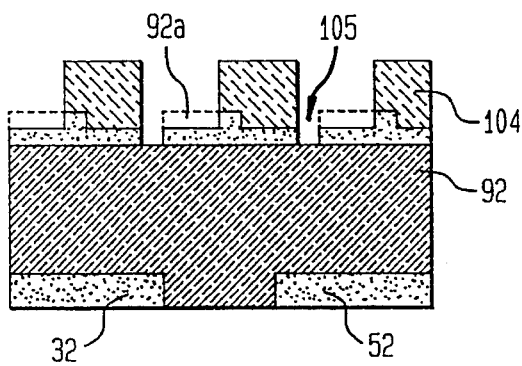
Figure 7C:
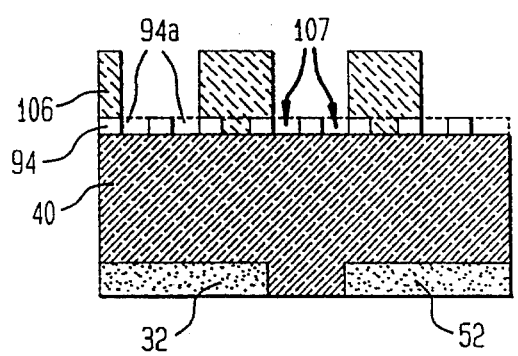
Figure 7D:
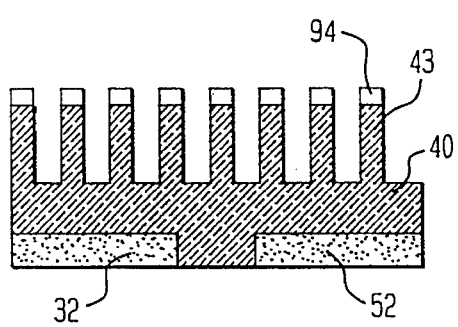
Figure 7E:
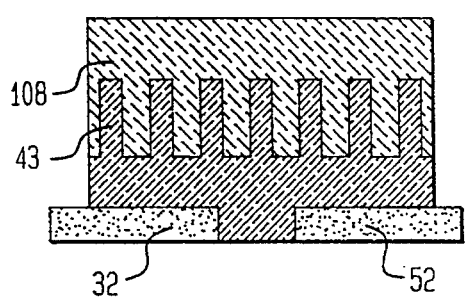
Figure 7F:
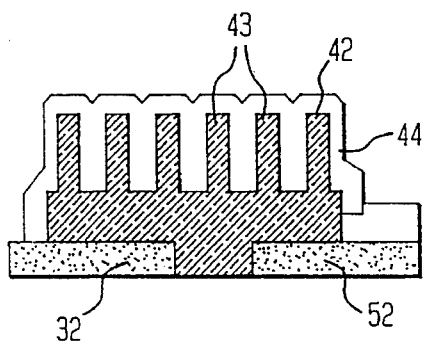

A capacitor used in a DRAM is formed in accordance with an illustrative embodiment of the invention as follows:

1. As shown in FIG. 7(a), a polysilicon (poly-2) electrode layer 40 is deposited on top of the oxide regions 32 and 52 and on top of the substrate 25 (not shown in FIG. 7(a), but see FIGS. 2–6). The poly-2 layer has a thickness between 5,000 to 10,000 Angstroms and is deposited by chemical vapor deposition or a similar technique after the formation of poly contacts.

2. The polysilicon electrode layer 40 is doped with POCl$_3$ or is implanted with phosphorous or arsenic or the like to become conductive.

3. A thin oxide layer 90 is deposited onto the polysilicon electrode layer 40, with thickness of between 1,000 to 4,000 Angstroms. The oxide layer 90 acts as a mask during subsequent etching of the polysilicon electrode layer 40.

4. Oxide regions 94 with a width and separation smaller than the feature size, e.g. 0.2 microns, equaling one third the feature size, are formed on the polysilicon layer 40 as follows:

4.1 A photoresist layer (not shown in FIG. 7(*a*)) is deposited on the oxide layer 90. The photoresist layer is then patterned by a conventional lithography method with a feature size of 0.6 microns, for example, to form three photoresist regions 102 each 0.6 microns wide for example. The photoresist regions 102 are illustratively separated by openings 103, having a width equal to that of regions 102, e.g. 0.6 microns.

4.2 Using photoresist regions 102 as a mask, oxide layer 90 is etched (e.g. using conventional reactive ion etching) to remove half the oxide's thickness, between 500 to 2,000 Angstroms. Phantom oxide regions 90*a*, represented by dashed lines, are etched away, each having a width equal to that of photoresist regions 102, e.g. 0.6 microns. An oxide layer of alternating thicknesses is thereby formed.

4.3 Photoresist regions 102 are removed. A new photoresist layer is deposited on oxide layer 90 and patterned to form photoresist regions 104 shown in FIG. 7(*b*). The photoresist regions 104 are located two thirds of the feature size, e.g. 0.4 microns, to the right from photoresist regions 102.

4.4 Using the photoresist regions 104 as a mask, oxide layer 90 is etched to remove half of the thickness of the oxide layer. Phantom oxide regions 92*a*, represented by dashed lines, are etched away. Oxide regions 92 are thereby formed. Oxide regions 92 are separated by openings 105 which expose the polysilicon layer 40 as shown in FIG. 7(*b*).

4.5 Photoresist regions 104 are removed. A new photoresist layer is deposited on oxide regions 92 and exposed polysilicon layer 40. The new photoresist layer is patterned to form photoresist regions 106 shown in FIG. 7(*c*). Photoresist regions 106 are located two thirds the feature size, e.g. 0.4 microns, to the right of photoresist regions 104.

4.6 Using photoresist regions 106 as a mask, oxide regions 92 are further etched to remove half of the thickness of the oxide regions. Phantom oxide regions 94*a*, represented by dashed lines, are etched away. Oxide regions 94 are thereby formed. Oxide regions 94 are separated by openings 107 which have a width equal to that of regions 94 as shown in FIG. 7(*c*), e.g. 0.2 microns.

5. Photoresist regions 106 are removed as shown in FIGS. 7(*c*) and (*d*).

6. Using oxide regions 94 as a mask, polysilicon layer 40 is etched to a depth of about 4,000–8,000 Angstroms. The result is pillars 43 shown in FIG. 7(*d*). These pillars have the shape of walls which extend perpendicular to the plane of the figure.

7. Oxide regions 94 are removed. A new photoresist layer is deposited on polysilicon layer 40. The new photoresist layer is patterned to form photoresist region 108 shown in FIG. 7(*e*). Photoresist region 108 covers the desired number of pillars 43, e.g. 6 pillars, leaving the rest of the pillars exposed.

8. Using photoresist region 108 as a mask, the polysilicon layer and exposed pillars are etched to a depth of about 5,000–10,000 Angstroms. The result is pillars 43 shown in FIG. 7(*e*). These pillars have the shape of walls which extend perpendicular to the plane of the figure.

9. Capacitor dielectric layer 42 shown in FIG. 7(*f*), is then deposited on top of the now modulated (i.e. modulated with the pillars 43) surface of the polysilicon electrode layer 40. The dielectric layer 42 may be ON, NO, ONO (where O is oxide and N is nitride) or the like and deposited using chemical vapor deposition (CVD), physical vapor deposition (PVD) or thermal treatments.

11. A second polysilicon electrode layer 44 shown in FIG. 7(*f*), is deposited on top of dielectric layer 42, doped to become conductive and etched to complete the capacitor.

12. The metalization (e.g. contact 27 of FIG. 2) is deposited to complete the DRAM cell structure.

It should be noted that the invention results in the formation of pillars 43 of dimensions smaller than other features on the same wafer. For example, the width of pillars 43 is one third the feature size. Thus, the polysilicon electrode layer 40 has a large surface area and the capacitance of the resulting capacitor is very large.

Finally, the above described embodiment of the invention are intended to be illustrative only. Numerous alternative embodiments may be devised by those skilled in the art without departing form the spirit and scope of the following claims.

We claim:

1. A method for forming a capacitor for use in a DRAM cell, comprising the steps of:

(a) forming a polysilicon electrode layer on a substrate;

(b) forming an oxide layer on the polysilicon electrode layer;

(c) forming a plurality of spaced apart oxide regions from said oxide layer by:

(i) patterning a first photoresist layer to form spaced apart photoresist regions;

(ii) etching the oxide layer through the patterned first photoresist layer;

(iii) forming a subsequent photoresist layer to form spaced apart photoresist regions, the subsequent layer being shifted a first amount from the first photoresist layer;

(iv) etching the oxide layer through the patterned subsequent layer; and (v) repeating steps iii and iv such that a plurality of spaced apart oxide regions are formed wherein the width of each oxide region is significantly smaller than the width of each said photoresist region; and (d) using said oxide regions as a mask, etching said polysilicon electrode layer to form pillars therein.

2. The method of claim 1, wherein steps iii and iv are performed twice, wherein each newly formed photoresist region is located at two thirds a width of the space between the photoresist regions from a previously formed photoresist region, and the oxide layer is etched to half its thickness.

3. A method for forming a capacitor for use in a DRAM cell, comprising the steps of:

(a) forming a polysilicon electrode layer on a substrate;

(b) forming an insulating layer having a depth on the polysilicon electrode layer;

(c) patterning a first photoresist layer defining a number of first spaces, the first spaces having a width;

(d) etching one-half of the depth of the exposed insulating layer;

(e) patterning a second photoresist layer defining a number of second spaces having the width, locating the second photoresist layer to align the spaces two-thirds the width in a first direction away from the first spaces;

(f) etching one-half of the depth of the insulation layer exposed by the second photoresist layer;

(g) patterning a third photoresist layer defining third spaces having the width, locating the third photoresist layer to align the spaces two-thirds the width in a second direction opposite the first direction away from the first spaces;

(h) etching one-half of the depth of the insulation layer exposed by the third photoresist layer;

(i) using the insulating regions as a mask, etching said polysilicon electrode layer to form pillars therein;

(j) forming a dielectric layer on the polysilicon electrode layer; and (k) forming a second polysilicon electrode layer on the dielectric layer.

4. The method according to claim 3, wherein:

(a) the step of forming a polysilicon electrode layer comprises depositing polysilicon by chemical vapor deposition, (b) the step of forming the insulating layer comprises depositing a thin oxide layer on to the polysilicon electrode, (c) the step of forming the dielectric layer comprises depositing a dielectric on the surface of pillars; and (d) the step of forming the second polysilicon electrode layer comprises depositing polysilicon on top of the dielectric layer.

5. The method according to claim 3, wherein the step of patterning the first photoresist layer comprises using a conventional lithography method, and wherein the width is 0.6 microns.

6. The method according to claim 3, wherein each step of etching comprises reactive ion etching.

* * * * *